US009966973B2

(12) United States Patent
Li et al.

(10) Patent No.: US 9,966,973 B2
(45) Date of Patent: *May 8, 2018

(54) METHOD AND APPARATUS FOR PROCESSING DATA

(71) Applicant: HUAWEI TECHNOLOGIES CO., LTD., Shenzhen, Guangdong (CN)

(72) Inventors: Bin Li, Shenzhen (CN); Hui Shen, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 27 days.

This patent is subject to a terminal disclaimer.

(21) Appl. No.: 15/092,581

(22) Filed: Apr. 6, 2016

(65) Prior Publication Data
US 2016/0218743 A1 Jul. 28, 2016

Related U.S. Application Data

(63) Continuation of application No. 14/714,616, filed on May 18, 2015, now Pat. No. 9,337,871, which is a
(Continued)

(30) Foreign Application Priority Data

Nov. 16, 2012 (CN) .......................... 2012 1 0462429

(51) Int. Cl.
H03M 7/34 (2006.01)
H03M 13/15 (2006.01)
(Continued)

(52) U.S. Cl.
CPC ......... *H03M 13/155* (2013.01); *H03M 13/13* (2013.01); *H03M 13/2792* (2013.01);
(Continued)

(58) Field of Classification Search
CPC ........... H03M 13/2957; H03M 13/235; H03M 13/2903; H03M 13/47; H03M 13/6525;
(Continued)

(56) References Cited

U.S. PATENT DOCUMENTS 6,396,423 B1   5/2002  Laumen et al.
6,944,348 B2   9/2005  Kajita
(Continued)

FOREIGN PATENT DOCUMENTS

CN   1366737 A   8/2002
CN   1866971 A   11/2006
(Continued)

OTHER PUBLICATIONS

"3rd Generation Partnership Project; Technical Specification Group Radio Access Network; Multiplexing and channel coding (FDD) (Release 5)", 3GPP TS 25.212 V5.9.0, Jun. 2004, total 77 pages.
(Continued)

*Primary Examiner* — Linh Nguyen
(74) *Attorney, Agent, or Firm* — Huawei Technologies Co., Ltd.

(57) ABSTRACT

A method for performing polar coding is disclosed in the application. A data block is segmented into a plurality of first blocks. Difference in bit length between any two first blocks is not more than one bit. For each first block, one or more consecutive padding bits is added to obtain a second block of a bit length K if the bit length of the first block is less than K, so as to obtain a plurality of second blocks corresponding to the first blocks. N−K consecutive bits are added to each of the second blocks to obtain a plurality of third blocks. Polar encoding is performed on the third blocks.

9 Claims, 2 Drawing Sheets

Related U.S. Application Data continuation of application No. PCT/CN2013/073803, filed on Apr. 7, 2013.

(51) Int. Cl.
*H03M 13/13* (2006.01)
*H04L 1/00* (2006.01)
*H03M 13/29* (2006.01)
*H03M 13/00* (2006.01)
*H03M 13/27* (2006.01)
*H03M 13/09* (2006.01)

(52) U.S. Cl.
CPC ... *H03M 13/2906* (2013.01); *H03M 13/2924* (2013.01); *H03M 13/2957* (2013.01); *H03M 13/611* (2013.01); *H03M 13/6356* (2013.01); *H03M 13/6516* (2013.01); *H04L 1/0057* (2013.01); *H03M 13/09* (2013.01)

(58) Field of Classification Search
CPC ............ H03M 13/09; H03M 13/2906; H03M 13/611; G06F 11/10; G06F 11/1016; G06F 11/1072; G06F 12/0246
USPC ........ 341/51, 55, 65, 66, 67, 70, 91, 92, 94, 341/107; 714/781, 755, 758, 786, 767
See application file for complete search history.

(56) References Cited

U.S. PATENT DOCUMENTS

| | | | |
|---|---|---|---|
| 7,152,198 B2 | 12/2006 | Kajita | |
| 7,890,834 B2 | 2/2011 | Blankenship et al. | |
| 7,925,956 B2 | 4/2011 | Nimbalker et al. | |
| 7,949,926 B2 | 5/2011 | Nimbalker et al. | |
| 8,046,668 B2 | 10/2011 | Rhee et al. | |
| 8,136,021 B2 | 3/2012 | Roh et al. | |
| 8,219,877 B2 | 7/2012 | Kim et al. | |
| 8,347,186 B1 | 1/2013 | Arikan | |
| 8,433,987 B2 | 4/2013 | Fan et al. | |
| 8,959,418 B1* | 2/2015 | Pfister | H03M 13/2948 714/746 |
| 9,007,241 B2* | 4/2015 | Alhussien | H03M 13/618 341/67 |
| 9,337,871 B2* | 5/2016 | Li | H03M 13/13 |
| 2002/0124224 A1* | 9/2002 | Blankenship | H03M 13/2771 714/758 |
| 2003/0188247 A1* | 10/2003 | Ahmed | H03M 13/2957 714/755 |
| 2004/0187062 A1 | 9/2004 | Kajita | |
| 2005/0204255 A1 | 9/2005 | Yeh et al. | |
| 2006/0262811 A1 | 11/2006 | Jiang | |
| 2008/0042586 A1 | 2/2008 | Kimura et al. | |
| 2008/0184088 A1* | 7/2008 | Yang | H03M 13/09 714/755 |
| 2008/0288850 A1 | 11/2008 | Rhee et al. | |
| 2008/0317152 A1 | 12/2008 | Sun et al. | |
| 2009/0297144 A1 | 12/2009 | Djordevic et al. | |
| 2010/0138718 A1 | 6/2010 | Frederiksen et al. | |
| 2010/0318878 A1 | 12/2010 | Mansour | |
| 2011/0019973 A1 | 1/2011 | Ido et al. | |
| 2012/0084617 A1* | 4/2012 | Djordjevic | H03M 13/033 714/752 |
| 2012/0240009 A1 | 9/2012 | Kim et al. | |
| 2013/0055049 A1* | 2/2013 | Murakami | H03M 13/1154 714/779 |
| 2013/0311857 A1* | 11/2013 | Murakami | H03M 13/1154 714/786 |
| 2014/0173376 A1* | 6/2014 | Jeong | H03M 13/2906 714/755 |
| 2014/0208183 A1 | 7/2014 | Mahdavifar et al. | |
| 2014/0208185 A1* | 7/2014 | Djordjevic | G06F 11/10 714/758 |

FOREIGN PATENT DOCUMENTS

| | | |
|---|---|---|
| CN | 1893342 A | 1/2007 |
| CN | 101170390 A | 4/2008 |
| CN | 101394187 A | 3/2009 |
| CN | 101595702 A | 12/2009 |
| CN | 101809958 A | 8/2010 |
| CN | 101821980 A | 9/2010 |
| CN | 101931489 A | 12/2010 |
| CN | 101964200 A | 2/2011 |
| CN | 102136886 A | 7/2011 |
| CN | 102164025 A | 8/2011 |
| EP | 2183867 B1 | 5/2014 |
| WO | 2008042586 A2 | 4/2008 |

OTHER PUBLICATIONS

"3rd Generation Partnership Project; Technical Specification Group Radio Access Network; Evolved Universal Terrestrial Radio Access (E-UTRA); Multiplexing and channel coding (Release 8)", 3GPP TS 36.212 V8.3.0, May 2008, total 48 pages.

"3rd Generation Partnership Project; Technical Specification Group Radio Access Network; Evolved Universal Terrestrial Radio Access (E-ULTA); Multiplexing and channel coding (Release 8)", 3GPP TS 36.212 V8.3.0, May 2008, total 48 pages.

"3rd Generation Partnership Project; Technical Specification Group Radio Access Network; Evolved Universal Terrestrial Radio Access (E-ULTA); Multiplexing and channel coding (Release 8)", 3GPP TS 36.212 V8.6.0, Mar. 2008, total 59 pages.

Kai Niu et al:"CRC-Aided Decoding of Polar Codes", IEEE communications letters, vol. 16, No. 10, Oct. 2012, XP011469263. total 4 pages.

3rd Generation Partnership Project; Technical Specification Group Radio Access Network;Multiplexing and channel coding (FDD) (Release 11). 3GPP TS 25.212 V11.3.0, Sep. 2012. total 135 pages.

3GPP TSG RAN WG1 #47 R1-063062, "Code Block Segmentation for Contention-free Turbo Interleavers", Motorola, Nov. 6-10, 2006, total 4 pages.

3GPP TS 25.212 V6.4.0 (Mar. 2005), 3rd Generation Partnership Project;Technical Specification Group Radio Access Network;Multiplexing and channel coding (FDD)(Release 6),total 85 pages.

* cited by examiner

METHOD AND APPARATUS FOR PROCESSING DATA

CROSS-REFERENCE TO RELATED APPLICATIONS

This application is a continuation of U.S. application Ser. No. 14/714,616, filed on May 18, 2015, which is a continuation of International Application No. PCT/CN2013/073803, filed on Apr. 7, 2013. The International Application claims priority to Chinese Patent Application No. 201210462429.3, filed on Nov. 16, 2012. The afore-mentioned patent applications are hereby incorporated by reference in their entirety.

TECHNICAL FIELD

The present application relates to communication technologies, and more particularly, to a method and an apparatus for processing data.

BACKGROUND

Under the guidance of information theory, theoretical research of channel encoding develops rapidly. Various encoding techniques with excellent performance have been developed, including block code, convolutional code, concatenated code, etc. For example, Turbo code is a concatenated code, and low-density parity-check (LDPC) code and polar code belong to block codes. Turbo code and LDPC code have been adopted in third-generation mobile communication technology (3G) and fourth-generation mobile communication technology (4G) standards. As a novel near-channel-capacity encoding technique, polar code has recently received a broad attention and is researched intensely.

In general, an encoder encodes an input bit (usually referred to as an information bit) with a bit length of K to produce an output bit (usually referred to as a codeword bit) with a bit length of N. An encoder of the Turbo code is relatively flexible, where a single mother code is adopted, and a variety of information bit lengths K are supported. The LDPC code supports a variety of information bit lengths K by means of structured expansion. A typical codeword length of the polar code is generally $2^n$, where n is an integer. The polar code, which is based on a basic code rate R (single mother code), cannot support flexible bit length selection for information bit length K and codeword bit length N.

In a Turbo encoding processing procedure of a long term evolution (LTE) system, once a length of a transport block (TB) exceeds a maximum input bit length of a Turbo encoder (i.e., a maximum interleaver size of 6144 bits of the Turbo code), this relatively long TB block needs to be divided into multiple shorter code blocks, so that a length of each code block, after a code block cyclic redundancy check (CRC) is added and a bit is filled, can satisfy an allowable input bit length (corresponding to 188 kinds of QPP interleaver sizes) of the Turbo encoder, thereby completing an encoding processing of each code block. In a code block segmentation process, all padding bits are always added at a starting position of the first code block.

The above-mentioned method for segmenting a code block and filling a padding bit has the following problems: lengths of code blocks are obviously different from each other, and padding bits are concentrated in a same code block, thus the code blocks have different performances, which damages an error rate performance of a TB block. Therefore, the method is not suitable for polar encoding processing and needs to be further improved.

SUMMARY

Embodiments of the present application provide a method for processing data, aimed to reduce performance difference between code blocks during polar encoding.

In a first aspect, a method for processing data is provided, and the method includes: performing code block segmentation on a data block to obtain multiple first blocks, wherein a difference between numbers of bits of any two first blocks in the multiple first blocks is not more than 1 bit; determining multiple second blocks according to a padding bit and the multiple first blocks, wherein a quantity of bits of each of the multiple second blocks is K, K is a quantity of information bits of a polar code, and a value of the padding bit is a preset value; adding consecutive N−K fixed bits to each of the multiple second blocks to obtain multiple third blocks, wherein a value of the fixed bit is a preset value, a value of N is $2^n$, n is an integer larger than 0, and N−K≥0; and performing polar encoding according to the multiple third blocks.

In a first possible implementation manner, in combination with the first aspect, the performing code block segmentation on a data block to obtain multiple first blocks may be specifically implemented by: if a quantity of bits of the data block is larger than K, dividing the data block into C first blocks; wherein a quantity of bits of each of the C first blocks, $K_r$, is as follows: when 1≤r≤B' mod C, $K_r=\lceil B'/C \rceil$, and when B' mod C<r≤C, $K_r=\lfloor B'/C \rfloor$; or when 1≤r≤B' mod C, $K_r=\lfloor B'/C \rfloor$, and when B' mod C<r≤C, $K_r=\lceil B'/C \rceil$; wherein r is a sequential quantity of the first block, 1<r<C, the quantity of the first blocks is $C=\lceil B/(K-J) \rceil$, a total quantity of bits of the C first blocks is B'=B+C·J, B is the quantity of bits of the data block, J is a quantity of check bits for performing cyclic redundancy check (CRC) on the first block, and 0≤J≤K.

In a second possible implementation manner, in combination with the first aspect, the determining multiple second blocks according to a padding bit and the multiple first blocks may be specifically implemented by: if a quantity of bits of any one of the first blocks is smaller than K, adding the padding bit to the first block with the quantity of bits smaller than K to form the second block, wherein a quantity of the padding bits of the $r^{th}$ second blocks is $K-K_r$, $K_r$ is the quantity of bits of the $r^{th}$ first block in the multiple first blocks, and 1≤r≤C; and if a quantity of bits of any one of the first blocks is equal to K, taking the first block with the quantity of bits equal to K as the second block.

In a third possible implementation manner, in combination with the second possible implementation manner of the first aspect, the adding the padding bit to the first block with the quantity of bits smaller than K to form the second block may be specifically implemented by adding the padding bit in front of the first block with the quantity of bits smaller than K to form the second block.

In a fourth possible implementation manner, in combination with the third possible implementation manner of the first aspect, the adding consecutive N−K fixed bits to each of the multiple second blocks to obtain multiple third blocks may be specifically implemented by: if the second block has the padding bit, adding consecutive N−K fixed bits at a position, that is in front of the padding bit and is adjacent to the padding bit, to obtain the third block; and if the second block does not have the padding bit, adding consecutive N−K fixed bits at a position, that is in front of the second block and is adjacent to the second block, to obtain the third block.

In a fifth possible implementation manner, in combination with the second possible implementation manner of the first aspect, the adding the padding bit to the first block with the quantity of bits smaller than K to form the second block may be specifically implemented by adding the padding bit behind the first block with the quantity of bits smaller than K to form the second block.

In a sixth possible implementation manner, in combination with the fifth possible implementation manner of the first aspect, the adding consecutive N−K fixed bits to each of the multiple second blocks to obtain multiple third blocks may be specifically implemented by: if the second block has the padding bit, adding consecutive N−K fixed bits at a position that is behind the padding bit and is adjacent to the padding bit to obtain the third block; and if the second block does not have the padding bit, adding consecutive N−K fixed bits at a position that is behind the second block and is adjacent to the second block to obtain the third block.

In a seventh possible implementation manner, in combination with the first aspect, the performing polar encoding according to the multiple third blocks may be specifically implemented by: performing interleaved mapping on the multiple third blocks to obtain multiple fourth blocks; and performing polar encoding on the multiple fourth blocks.

In an eighth possible implementation manner, in combination with the seventh possible implementation manner of the first aspect, the performing interleaved mapping on the multiple third blocks to obtain multiple fourth blocks may be specifically implemented by determining the multiple fourth blocks according to a mapping relationship $c_{ri_x}^\pi = c_{rx}$, x=0, 1, ..., N−1, wherein $C_r = [c_{r0}, c_{r1}, c_{r2}, c_{r3}, \ldots, c_{r(N-1)}]$ denotes the $r^{th}$ third block in the multiple third blocks, $C_r^\pi = [c_{r0}^\pi, c_{r1}^\pi, c_{r2}^\pi, c_{r3}^\pi, \ldots, c_{r(N-1)}^\pi]$ denotes the $r^{th}$ fourth block in the multiple fourth blocks, 1≤r≤C, C is a quantity of the multiple third blocks, $\pi_N = (i_0, i_1, i_2, \ldots, i_{N-1})$, $i_x \in \{0, \ldots, N-1\}$, 0≤x≤N−1 is an expression of an interleaved sequence of the interleaved mapping, and any two elements of the interleaved sequence are different from each other.

In a second aspect, an apparatus for processing data is provided, and the apparatus includes: a first obtaining unit, configured to perform code block segmentation on a data block to obtain multiple first blocks, wherein a difference between numbers of bits of any two first blocks in the multiple first blocks is not more than 1 bit; a determining unit, configured to determine multiple second blocks according to a padding bit and the multiple first blocks, wherein a quantity of bits of each of the multiple second blocks is K, K is a quantity of information bits of a polar code, and the value of the padding bit is a preset value; a second obtaining unit, configured to add consecutive N−K fixed bits to each of the multiple second blocks to obtain multiple third blocks, wherein a value of the fixed bit is a preset value, a value of N is 2^n, n is an integer larger than 0, and N−K≥0; and an encoding unit, configured to perform polar encoding according to the third blocks.

In a first possible implementation manner, in combination with the second aspect, a specific implementation is as follows: if a quantity of bits of the data block is larger than K, the first obtaining unit may divide the data block into C first blocks, wherein a quantity of bits $K_r$ of each of the C first blocks is as follows: when 1≤r≤B' mod C, $K_r = \lceil B'/C \rceil$, and when B' mod C<r≤C, $K_r = \lfloor B'/C \rfloor$; or when 1≤r≤B' mod C, $K_r = \lfloor B'/C \rfloor$, and when B' mod C<r≤C, $K_r = \lceil B'/C \rceil$; wherein r is a sequential quantity of the first block, 1≤r≤C, the quantity of the first blocks is C=⌈B/(K−J)⌉, a total quantity of bits of the C first blocks is B'=B+C·J, B is the quantity of bits of the data block, J is a quantity of check bits which needs to be added for performing cyclic redundancy check (CRC) on the first block, and 0≤J≤K.

In a second possible implementation manner, in combination with the second aspect, a specific implementation is as follows: if a quantity of bits of any one of the first blocks is smaller than K, the determining unit may add the padding bit to the first block with the quantity of bits smaller than K to form the second block, wherein a quantity of the padding bits of the $r^{th}$ second blocks is K−$K_r$, $K_r$ is the quantity of bits of the $r^{th}$ first block in the multiple first blocks, and 1≤r≤C; and if a quantity of bits of any one of the first blocks is equal to K, the determining unit may take the first blocks with the quantity of bits equal to K as the second block.

In a third possible implementation manner, in combination with the second possible implementation manner of the second aspect, a specific implementation is as follows: the determining unit may add the padding bit in front of the first block with the quantity of bits smaller than K to form the second block.

In a fourth possible implementation manner, in combination with the third possible implementation manner of the second aspect, a specific implementation is as follows: if the second block has the padding bit, the second obtaining unit may add consecutive N−K fixed bits at a position, that is in front of the padding bit and is adjacent to the padding bit, to obtain the third block; and if the second block does not have the padding bit, the second obtaining unit may add consecutive N−K fixed bits at a position, that is in front of the second block and is adjacent to the second block, to obtain the third block.

In a fifth possible implementation manner, in combination with the second possible implementation manner of the second aspect, a specific implementation is as follows: the determining unit may add the padding bit behind the first block with the quantity of bits smaller than K to form the second block.

In a sixth possible implementation manner, in combination with the fifth possible implementation manner of the second aspect, a specific implementation is as follows: if the second block has the padding bit, the second obtaining unit may add consecutive N−K fixed bits at a position that is behind the padding bit and is adjacent to the padding bit to obtain the third block; and if the second block does not have the padding bit, the second obtaining unit may add consecutive N−K fixed bits at a position that is behind the second block and is adjacent to the second block to obtain the third block.

In a seventh possible implementation manner, in combination with the second aspect, the encoding unit may be implemented to: perform interleaved mapping on the multiple third blocks to obtain multiple fourth blocks; and perform polar encoding on the multiple fourth blocks.

In an eighth possible implementation manner, in combination with the seventh possible implementation manner of the second aspect, performing, by the encoding unit, interleaved mapping on the multiple third blocks to obtain multiple fourth blocks, may be specifically implemented as follows: the encoding unit may determine the multiple fourth blocks according to a mapping relationship $c_{ri_x}^\pi = c_{rx}$, x=0, 1, ..., N−1, wherein $C_r = [c_{r0}, c_{r1}, c_{r2}, c_{r3}, \ldots, c_{r(N-1)}]$ denotes the r block in the multiple third blocks, $C_r^\pi = [c_{r0}^\pi, c_{r1}^\pi, c_{r2}^\pi, c_{r3}^\pi, \ldots, c_{r(N-1)}^\pi]$ denotes the $r^{th}$ fourth block in the multiple fourth) blocks, 1≤r≤C, C is a quantity of the multiple third blocks, $\Pi_N = (i_0, i_1, i_2, \ldots, i_{N-1})$, $i_x \in \{0, \ldots,$ N-1}, 0≤x≤N-1 is an expression of an interleaved sequence of the interleaved mapping, and any two elements of the interleaved sequence are different from each other.

In the embodiments of the present application, by uniformly segmenting the data block to the greatest extent and performing bit filling processing and fixed bit processing, polar encoding can be performed and performance difference between code blocks is reduced.

BRIEF DESCRIPTION OF DRAWINGS

The following is a brief description of the accompanying drawings which are used in describing the embodiments of the present application.

DESCRIPTION OF EMBODIMENTS

The technical solution in the embodiments of the present invention will be described in conjunction with the accompanying drawings. It should be understood that, the technical solution in the embodiments of the present application can be applied to various communication systems, such as a global system of mobile communication (GSM), a code division multiple access (CDMA) system, a wideband code division multiple access (WCDMA) system, a general packet radio service (GPRS), a long term evolution (LTE) system, an LTE frequency division duplex (FDD,) system, an LTE time division duplex (TDD) system, a universal mobile telecommunication system (UMTS) and the like.

Figure 1:
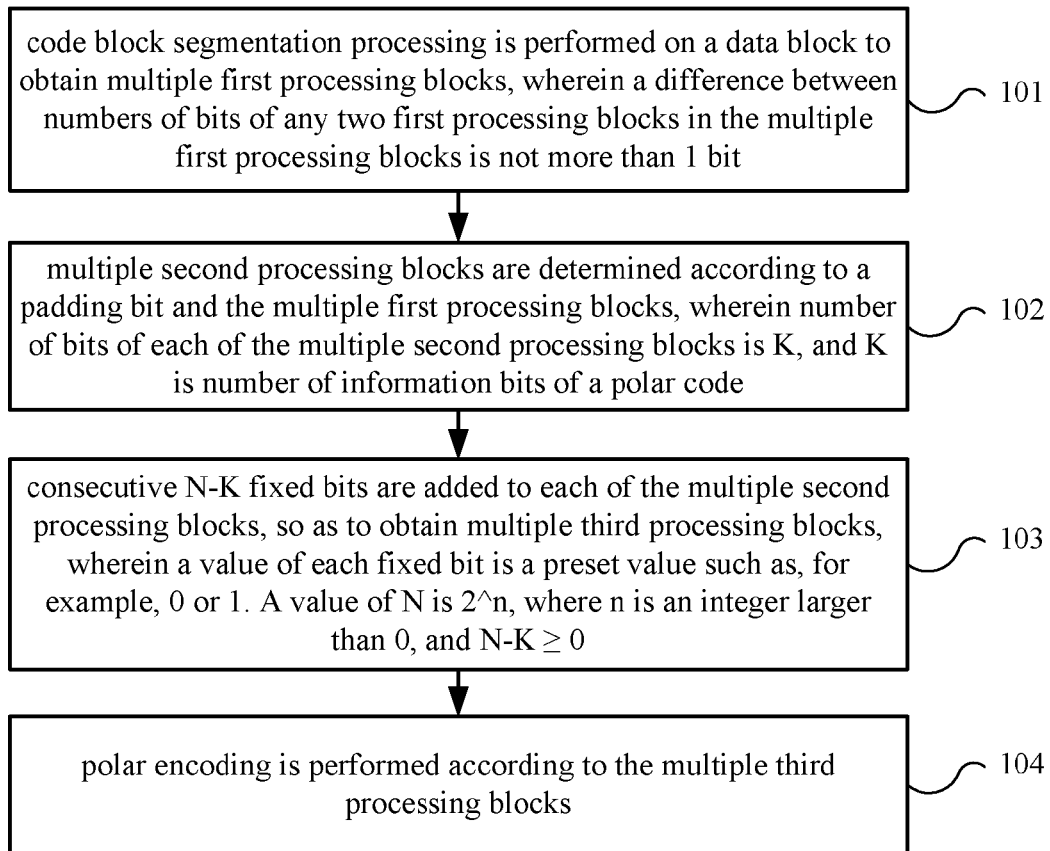
FIG. 1 is a flowchart of a method for performing polar encoding on a data block according to an embodiment of the present application.

FIG. 1 is a flowchart of a method for performing polar encoding on a data block according to an embodiment of the present application. The method of FIG. 1 is performed by an apparatus for processing data. The apparatus for processing data may be an apparatus for polar encoding.

101, code block segmentation is performed on a data block to obtain multiple first blocks, wherein a difference between numbers of bits of any two first blocks in the multiple first blocks is not more than 1 bit.

102, multiple second blocks are determined according to a padding bit and the multiple first blocks, wherein a quantity of bits of each of the multiple second blocks is K, and K is a quantity of information bits of a polar code. A value of the padding bit is a preset value such as, for example, 0 or 1.

103, consecutive N-K fixed bits are added to each of the multiple second blocks, so as to obtain multiple third blocks, wherein a value of each fixed bit is a preset value such as, for example, 0 or 1. A value of N is $2^n$, where n is an integer larger than 0, and N-K≥0.

104, polar encoding is performed according to the multiple third blocks.

In the embodiment of the present application, by segmenting the data block uniformly to the greatest extent and performing bit filling processing and fixed bit processing, polar encoding can be performed and performance difference between code blocks is reduced.

In the embodiment of the present application, the data block may be a data block with a check bit for performing CRC check on a transport block added in front of the transport block or behind the transport block, or the data block may be a transport block with no CRC check bit added. If the data block is the data block with the check bit for performing CRC check on a transport block added in front of the transport block or added behind the transport block, one manner for CRC check is as follows: it is assumed that input bits (a transport block with no CRC check bit added) are $a_0, a_1, a_2, a_3, \ldots, a_{A-1}$, calculated CRC check bits are $p_0, p_1, p_2, p_3, \ldots, p_{L-1}$, and output bits (a transport block after CRC check being performed), where A is a length of an input sequence, namely, is a quantity of the input bits, L is a quantity of check bits, and B=A+L.

One specific relationship between an output bit $b_k$ and an input bit $a_k$ and between the output bit $b_k$ and a check bit $p_{k-A}$ that needs to be added for performing CRC check on a transport block is:

$b_k=a_k$, when k=0, 1, 2, ..., A−1;
$b_k=p_{k-A}$, when k=A, A+1, A+2, ..., A+L−1;

namely, the output bit is obtained by adding the check bit that needs to be added for performing CRC check on a transport block behind the input bit (the transport block with no CRC check bit added).

One specific relationship between an output bit $b_k$ and an input bit $a_{k-L}$ and between the output bit $b_k$ and a check bit $p_k$ needing to be added for performing CRC check on a transport block is as follows:

$b_k=p_k$, when k=0, 1, 2, ..., L−1;
$b_k=a_{k-L}$, when k=L, L+1, L+2, ..., A+L−1;

namely, the output bit is obtained by adding the check bit that needs to be added for performing CRC check on a transport block in front of the input bit (the transport block with no CRC check bit added).

In the embodiment of the present application, if a data block is added with CRC check, a feedback indication of HARQ (hybrid automatic repeat request) may be determined.

In step 101, when code block segmentation is performed on the data block to obtain the first blocks, it is assumed that the data block (i.e., the input bits) is $b_0, b_1, b_2, b_3, \ldots, b_{B-1}$, and B is a quantity of bits of the data block before the code block segmentation. K is a quantity of information bits of polar encoding and is a preset parameter. C is a quantity of the first blocks obtained after the code block segmentation. J is a quantity of check bits for CRC check in each first block, where 0≤J≤K. B' is a total quantity of bits of the C first blocks. r is a sequential quantity of a first block, where 1≤r≤C.

If the quantity of bits of the data block, B, is smaller than or equal to K, no CRC check bit is added to the data block, the quantity of output code blocks (i.e., the first blocks) C=1, the quantity of check codes of each code block J=0, and the total quantity of bits of the output bits B'=B. In this case, the output bits are the input bits.

If the quantity of bits of the data block, B, is larger than K, the data block is divided into C first blocks, where C=⌈B/(K−J)⌉, and B'=B+C·J. J is a quantity of check bits for performing cyclic redundancy check (CRC) in the first block, where 0≤J≤K.

A specific implementation manner of the embodiment of the present application is as follows: the quantity of bits of each of the C first blocks, $K_r$, is as follows: when 1≤r≤B' mod C, $K_r$=⌈B'/C⌉; and when B' mod C<r≤C, $K_r$=⌊B'/C⌋.

A specific implementation manner of the embodiment of the present application is as follows: the quantity of bits of each of the C first blocks, $K_r$, is as follows: when 1≤r≤B' mod C, $K_r$=⌊B'/C⌋; and when B' mod C<r≤C, $K_r$=⌈B'/C⌉.

The data block is segmented relatively uniformly, so as to enable generally identical encoding efficiency for each data block, thereby reducing processing performance difference between code blocks.

In step 102, when the multiple second blocks are determined according to the padding bit and the multiple first blocks, a quantity of bits of a first block is firstly determined, and whether to add the padding bit is determined according to the quantity of bits of the first block.

If the quantity of bits of a first block is K, the first block may be taken as a second block, and the padding bit does not need to be added.

If the quantity of bits $K_r$ of a first block is smaller than K, K–$K_r$ consecutive padding bits may be added to the first block, where $K_r$ represents the quantity of bits of the $r^{th}$ first block in the multiple first blocks, and 1≤r≤C. There may be two manners for adding the padding bits, one manner is to add K–$K_r$ consecutive padding bits in front of a first block, and the other manner is to add K–$K_r$ consecutive padding bits behind the first block. It should be noted that, when the padding bit is added to the first blocks, a filling manner should be kept uniformly. That is, if padding bits need to be added, the padding bits are collectively added in front of first blocks with a quantity of bits smaller than K, or the padding bits are collectively added behind the first blocks with the quantity of bits smaller than K. A situation that some padding bits are added in front of the first blocks and some padding bits are added behind the first blocks should not occur. In this case, the quantity of bits of each second block is K.

In step 103, when the fixed bits are added to the multiple second blocks to obtain the multiple third blocks, the fixed bits need to be added according to a filling condition of the padding bit.

If the manner for filling the padding bit is to add the padding bit in front of a first block with a quantity of bits smaller than K, then if a second block has a padding bit, consecutive N–K fixed bits are added at a position that is in front of the padding bits and is adjacent to the padding bit to obtain a third block; and if a second block does not have a padding bit, consecutive N–K fixed bits are added at a position that is in front of the second block and is adjacent to the second block to obtain a third block. In other words, no matter whether a second block has a padding bit or not, a manner for adding the fixed bits is to add consecutive N–K fixed bits at a position that is in front of the second block and is adjacent to the second block.

If the manner for filling the padding bit is to add the padding bit behind a first block with a quantity of bits smaller than K, then if a second block has a padding bit, consecutive N–K fixed bits are added at a position that is behind the padding bit and is adjacent to the padding bit to obtain a third block; and if the second block does not have padding bit, consecutive N–K fixed bits are added at a position that is behind the second block and is adjacent to the second block to obtain a third block. In other words, no matter whether a second block has the padding bit or not, a manner for adding the fixed bits is to add consecutive N–K fixed bits at a position that is behind the second block and is adjacent to the second block.

In one special situation, if all of the multiple second blocks do not have the padding bit, consecutive N–K fixed bits may be uniformly added at a position that is in front of each second block and is adjacent to each second block, so as to obtain the third blocks; or consecutive N–K fixed bits are uniformly added at a position that is behind each second block and is adjacent to each second block, so as to obtain the third blocks.

Optionally, in step 104, polar encoding may be directly performed on the multiple third blocks. A method for polar encoding in the prior art may be referred to for a manner for performing polar encoding on the third blocks, which will not be repeated redundantly herein in the present application.

In step 104, interleaved mapping may be further performed on the multiple third blocks to obtain multiple fourth blocks, and polar encoding is performed on the multiple fourth blocks.

Further, when interleaved mapping is performed on the third blocks to obtain the fourth blocks, it may be processed according to the following manner: it is assumed that the $r^{th}$ third block in the multiple third blocks is $C_r=[c_{r0}, c_{r1}, c_{r2}, c_{r3}, \ldots, c_{r(N-1)}]$, where 1≤r≤C. An interleaved sequence $\Pi_N=(i_0, i_1, i_2, \ldots, i_{N-1})$ is firstly determined, where $i_x \in \{0, \ldots, N-1\}$, 0≤x≤N–1, and any two elements of the interleaved sequence are different from each other. Interleaved mapping processing is performed on the $r^{th}$ third block according to the interleaved sequence, wherein a relationship of the processed $r^{th}$ fourth block $C_r^\pi=[c_{r0}^\pi, c_{r1}^\pi, c_{r2}^\pi, c_{r3}^\pi, \ldots, c_{r(N-1)}^\pi]$ and the $r^{th}$ third block is as follows: $C_{ri_x}^\pi = c_{rx}$, x=0, 1, ..., N–1.

Figure 2:
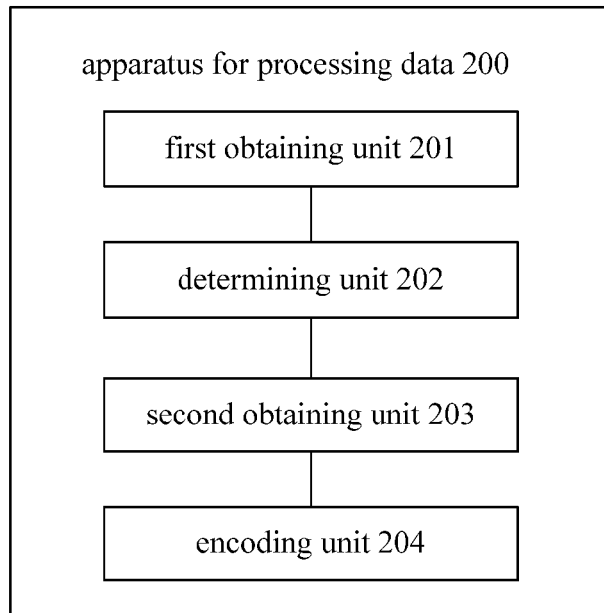
FIG. 2 is a functional block diagram of an apparatus for processing data according to an embodiment of the present application.

FIG. 2 is a schematic block diagram of an apparatus for processing data 200 in an embodiment of the present application. The apparatus for processing data 200 may include a first obtaining unit 201, a determining unit 202, a second obtaining unit 203 and an encoding unit 204.

The first obtaining unit 201 may perform code block segmentation on a data block to obtain multiple first blocks, wherein a difference between numbers of bits of any two first blocks in the multiple first blocks is not more than 1 bit.

The determining unit 202 may determine multiple second blocks according to a padding bit and the multiple first blocks, wherein a quantity of bits of each of the multiple second blocks is K, K is the quantity of information bits of a polar code, and a value of the padding bit is a preset value such as, for example, 0 or 1.

The second obtaining unit 203 may add consecutive N–K fixed bits to each of the multiple second blocks to obtain multiple third blocks, wherein a value of the fixed bit is a preset value, a value of N is 2^n, n is an integer larger than 0, and N–K≥0.

The encoding unit 204 may perform polar encoding according to the third blocks.

In the embodiment of the present application, the apparatus for processing data 200 may uniformly segment the data block to the greatest extent and perform bit filling processing and fixed bit processing, thereby enabling polar encoding to be performed and reducing performance difference between code blocks.

In the embodiment of the present application, the data block may be a data block that is added with a check bit for performing CRC check on a transport block in front of the transport block or behind the transport block, or may be a transport block with no CRC check bit added.

Optionally, when the first obtaining unit 201 performs the code block segmentation on the data block to obtain the multiple first blocks, if a quantity of bits of the data block, B, is larger than K, the first obtaining unit 201 divides the data block into C first blocks, wherein C=⌈B/(K–J)⌉, and B'=B+C·J. J is a quantity of check bits for performing cyclic redundancy check (CRC) on the first block, and 0≤J≤K.

A specific implementation manner of the embodiment of the present application is as follows: the quantity of bits of each of the C first blocks, $K_r$, is as follows: when $1 \le r \le B'$ mod C, $K_r = \lceil B'/C \rceil$; and when B' mod $C < r \le C$, $K_r = \lfloor B'/C \rfloor$.

A specific implementation manner of the embodiment of the present application is as follows: the quantity of bits of each of the C first blocks, $K_r$, is as follows: when $1 \le r \le B'$ mod C, $K_r = \lfloor B'/C \rfloor$; when B' mod $C < r \le C$, $K_r = \lceil B'/C \rceil$.

By segmenting the data block relatively uniformly, basically identical encoding efficiency of each data block is ensured, thereby reducing processing performance difference between the code blocks.

When the determining unit 202 determines the multiple second blocks according to the padding bit and the multiple first blocks, the determining unit 202 may firstly determine a quantity of bits of the first block and determine whether to add the padding bit or not according to the quantity of the first blocks. If the quantity of bits of a first block is K, the determining unit 202 may take the first block as the second block and the padding bit does not need to be added. If the quantity of bits $K_r$ of a first block is smaller than K, the determining unit 202 may add $K-K_r$ consecutive padding bits to the first block, wherein $K_r$ is the quantity of bits of the $r^{th}$ first block in the multiple first blocks, and $1 \le r \le C$. There may be two manners for adding the padding bit, one manner is to add $K-K_r$ consecutive padding bits in front of the first block; and one is to add the $K-K_r$ consecutive padding bits behind the first block. It should be noted that, when the padding bit is added to the first block, the filling manner should be kept uniformly. That is, if padding bits need to be added, the padding bits are collectively added in front of first block with a quantity of bits smaller than K, or the padding bits are collectively added behind the first block with quantity of bits smaller than K. A situation that some padding bits are added in front of the first blocks and some padding bits are added behind the first blocks should not occur. In this case, the quantity of bits of each second block is K.

When fixed bit(s) is added to the multiple second blocks to obtain the multiple third blocks, the second obtaining unit 203 may add the fixed bits according to a filling condition of the padding bit.

If a manner for the second obtaining unit 203 to fill the padding bit is adding in front of the first block with a quantity of bits smaller than K, if the second block has the padding bit, the second obtaining unit 203 adds consecutive N−K fixed bits at a position that is in front of the padding bit and is adjacent to the padding bit to obtain the third block; and if the second block does not have the padding bit, the second obtaining unit 203 adds consecutive N−K fixed bits at a position that is in front of the second block and is adjacent to the second block to obtain the third block. Actually, no matter whether the second block has the padding bit or not, a manner for the second obtaining unit 203 to add the fixed bit(s) is to add consecutive N−K fixed bits at a position that is in front of the second block and is adjacent to the second block.

If a manner for the second obtaining unit 203 to fill the padding bit is adding behind the first block with a quantity of bits smaller than K, if the second block has the padding bit, the second obtaining unit 203 adds consecutive N−K fixed bits at a position that is in front of the padding bit and is adjacent to the padding bit to obtain the third block; and if the second block does not have the padding bit, the second obtaining unit 203 adds consecutive N−K fixed bits at a position that is in front of the second block and is adjacent to the second block to obtain the third block. Actually, no matter whether the second block has the padding bit or not, a manner for the second obtaining unit 203 to add the fixed bit(s) is to add consecutive N−K fixed bits at a position that is behind the second block and is adjacent to the second block.

In one special condition, if all of the multiple second blocks do not have the padding bit, the second obtaining unit 203 may uniformly add consecutive N−K fixed bits at a position that is in front of each second block and is adjacent to each second block, so as to obtain the third blocks; or the second obtaining unit 203 may uniformly add consecutive N−K fixed bits at a position that is behind each second block and is adjacent to each second block, so as to obtain the third blocks.

Optionally, when the encoding unit 204 performs polar encoding on the multiple third blocks, the encoding unit 204 may directly perform polar encoding on the multiple third blocks. A polar encoding method in the prior art may be referred to for a polar encoding method for the third blocks, which will not be repeated redundantly in the present application.

When the encoding unit 204 performs polar encoding on the multiple third blocks, the encoding unit 204 may firstly perform interleaved mapping on the multiple third blocks to obtain multiple fourth blocks, and perform polar encoding on the multiple fourth blocks.

Further, when the encoding unit 204 performs interleaved mapping on the third blocks to obtain the fourth blocks, the encoding unit 204 may process in the following manner: it is assumed that the $r^{th}$ third block in the multiple third blocks is $C_r = [c_{r0}, c_{r1}, c_{r2}, c_{r3}, \ldots, c_{r(N-1)}]$, where $1 \le r \le C$. An interleaved sequence $\Pi_N = (i_0, i_1, i_2, \ldots, i_{N-1})$ is firstly determined, where $i_x \in \{0, \ldots, N-1\}$, $0 \le x \le N-1$, and any two elements of the interleaved sequence are different from each other. The encoding unit 204 may perform interleaved mapping processing on the $r^{th}$ third block according to the interleaved sequence, wherein a relationship of the processed $r^{th}$ forth block $C_r^\pi = [c_{r0}^\pi, c_{r1}^\pi, c_{r2}^\pi, c_{r3}^\pi, \ldots, c_{r(N-1)}^\pi]$ and the $r^{th}$ third block is as follows: $c_{ri_x}^\pi = c_{rx}$, $x=0, 1, \ldots, N-1$.

Figure 3:
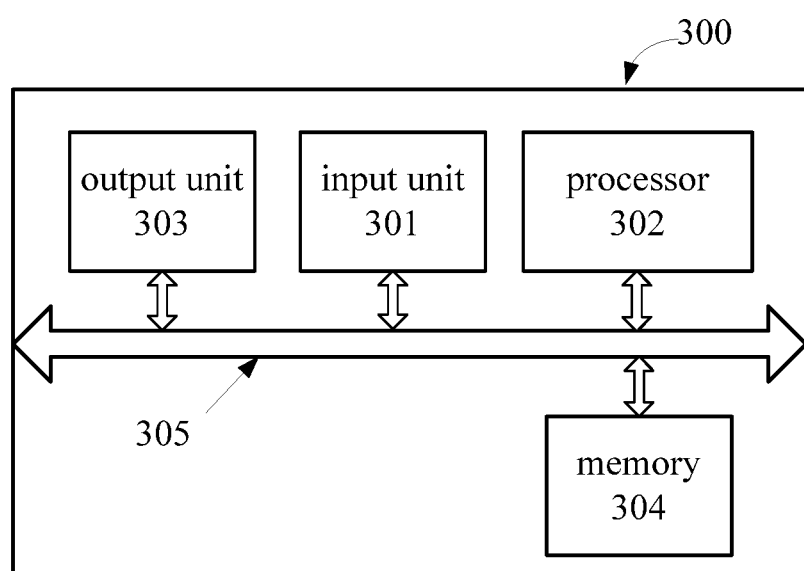
FIG. 3 is a simplified block diagram of an apparatus for processing data according to an embodiment of the present application.

FIG. 3 is a schematic block diagram of an apparatus for processing data 300 according to an embodiment of the present application. The apparatus for processing data 300 includes an input unit 301, an output unit 303, a processor 302 and a memory 304.

The processor 302 is configured to perform code block segmentation on a data block to obtain multiple first blocks, wherein a difference between numbers of bits of any two first blocks in the multiple first blocks is not more than 1 bit.

The memory 304 is configured to store an instruction that enables the processor 302 to perform code block segmentation on the data block to obtain the multiple first blocks.

The processor 302 may further configured to determine multiple second blocks according to a padding bit and the multiple first blocks, wherein a quantity of bits of each of the multiple second blocks is K, and K is the quantity of information bits of a polar code. A value of the padding bit is a preset value such as, for example, 0 or 1. The memory 304 may further configured to store an instruction that enables the processor 302 to determine the multiple second blocks according to the padding bit and the multiple first blocks.

The processor 302 may further configured to add consecutive N−K fixed bits to each of the multiple second blocks to obtain multiple third blocks, wherein a value of the fixed bit is a preset value such as, for example, 0 or 1. A value of N is $2^n$, n is an integer larger than 0, and N−K≥0.

The memory 304 may further configured to store an instruction that enables the processor 302 to add consecutive N−K fixed bits to each of the multiple second blocks to obtain the multiple third blocks The processor 302 may further configured to perform polar encoding according to the multiple third blocks. The memory 304 may further configured to store an instruction that enables the processor 302 to perform polar encoding according to the multiple third blocks.

In the embodiment of the present application, the apparatus for processing data 300 may uniformly segment the data block to the greatest extent and perform bit filling processing and fixed bit processing, thereby enabling polar encoding to be performed and reducing performance difference between code blocks.

The processor 302 controls an operation of the apparatus for processing data 300, and the processor 302 may also be called as a central processing unit (CPU). The memory 304 may include a read only memory (ROM) and a random access memory (RAM), and provides an instruction and data to the processor 302. A part of the memory 304 may further include a non-volatile random access memory (NVRAM). In a specific application, respective assemblies of the apparatus 300 are coupled together through a bus system 305, wherein besides a data bus, the bus system 305 may further include a power supply bus, a control bus and a status signal bus and/or the like. However, in order for clear illustration, various buses are marked as a bus system 305 in the figure.

The method disclosed in the above-mentioned embodiment of the present application may be applied to the processor 302 or is implemented by the processor 302. The processor 302 may be an integrated circuit chip having signal processing capability. In an implementation process, respective steps of the above-mentioned method may be completed by an integrated logic circuit of a hardware or an instruction in a form of software in the processor 302. The above-mentioned processor 302 may be a general-purpose processor, a digital signal processor (DSP), an application specific integrated circuit (ASIC), a field programmable gate array (FPGA) or other programmable logic device, a discrete gate, a transistor logic device or a discrete hardware assembly. The processor 302 may achieve or implement the respective methods, steps and the logic block diagrams disclosed in the embodiment of the present application. The general-purpose processor may be a microprocessor, or the processor may be any common processor or the like. The steps of the method disclosed in the embodiment of the present application may be directly implemented by a hardware decoding processor, or is cooperatively implemented by a hardware and a software module in a decoding processor. The software module may be located in a mature storage media in the art such as a random access memory, a flash memory, a read-only memory, a programmable read-only memory, an electrically erasable programmable memory, a register or the like. The storage medium is located in the memory 304. The processor 302 reads information in the memory 304, and completes the steps of the above-mentioned method in combination with a hardware thereof.

In the embodiment of the present application, the data block may be a data block that is added with a check bit for performing CRC check on a transport block in front of the transport block or behind the transport block, or may be a transport block with no CRC check bit added.

When the processor 302 performs code block segmentation on the data block to obtain the multiple first blocks, if a quantity of bits of the data block, B, is larger than K, the processor 302 divides the data block into C first blocks, wherein $C=\lceil B/(K-J) \rceil$, and $B'=B+C \cdot J$. J is a quantity of check bits for performing cyclic redundancy check (CRC) on the first block, and $0 \le J \le K$.

A specific implementation manner of the embodiment of the present application is as follows: a quantity of bits of each of the C first blocks, $K_r$, is as follows: when and when $1 \le r \le B'$ mod C, $K_r = \lceil B'/C \rceil$, and when $B'$ mod $C < r \le C$, $K_r = \lfloor B'/C \rfloor$.

A specific implementation manner of the embodiment of the present application is as follows: a quantity of bits of each of the C first blocks, $K_r$, is as follows: when $1 \le r \le B'$ mod C, $K_r = \lfloor B'/C \rfloor$, when $B'$ mod $C < r \le C$, $K_r = \lceil B'/C \rceil$.

By segmenting the data block relatively uniformly, basically identical encoding efficiency of each data block is ensured, thereby reducing processing performance difference between the code blocks.

When the processor 302 determines the multiple second blocks according to the padding bit and the multiple first blocks, the processor 302 may firstly determine a quantity of bits of the first block and determine whether to add the padding bit or not according to the quantity of the first blocks. If the quantity of bits of a first block is K, the processor 302 may take the first block as the second block and the padding bit does not need to be added. If the quantity of bits $K_r$ of a first block is smaller than K, the processor 302 may add $K-K_r$ consecutive padding bits to the first block, wherein $K_r$ is the quantity of bits of the $r^{th}$ first block in the multiple first blocks, and $1 \le r \le C$. There may be two manners for adding the padding bit, one manner is to add $K-K_r$ consecutive padding bits in front of the first block; and one is to add the $K-K_r$ consecutive padding bits behind the first block. It should be noted that, when the padding bit is added to the first block, the filling manner should be kept uniformly. That is, if padding bits need to be added, the padding bits are collectively added in front of first block with a quantity of bits smaller than K, or the padding bits are collectively added behind the first block with a quantity of bits smaller than K. A situation that some padding bits are added in front of the first blocks and some padding bits are added behind the first blocks should not occur. In this case, the quantity of bits of each second block is K.

When fixed bit(s) is added to the multiple second blocks to obtain the multiple third blocks, the processor 302 may add the fixed bits according to a filling condition of the padding bit.

If a manner for the processor 302 to fill the padding bit is adding in front of the first block with a quantity of bits smaller than K, if the second block has the padding bit, the processor 302 adds consecutive N−K fixed bits at a position that is in front of the padding bit and is adjacent to the padding bit to obtain the third block; and if the second block does not have the padding bit, the processor 302 adds consecutive N−K fixed bits at a position that is in front of the second block and is adjacent to the second block to obtain the third block. Actually, no matter whether the second block has the padding bit or not, a manner for the processor 302 to add the fixed bit(s) is to add consecutive N−K fixed bits at a position that is in front of the second block and is adjacent to the second block.

If a manner for the processor 302 to fill the padding bit is adding behind the first block with a quantity of bits smaller than K, if the second block has the padding bit, the processor 302 adds consecutive N−K fixed bits at a position that is in front of the padding bit and is adjacent to the padding bit to obtain the third block; and if the second block does not have the padding bit, the processor 302 adds consecutive N−K fixed bits at a position that is in front of the second block and is adjacent to the second block to obtain the third block. Actually, no matter whether the second block has the padding bit or not, a manner for the processor 302 to add the fixed bit(s) is to add consecutive N–K fixed bits at a position that is behind the second block and is adjacent to the second block.

In one special condition, if all of the multiple second blocks do not have the padding bit, the processor 302 may uniformly add consecutive N–K fixed bits at a position that is in front of each second block and is adjacent to each second block, so as to obtain the third blocks; or the processor 302 may uniformly add consecutive N–K fixed bits at a position that is behind each second block and is adjacent to each second block, so as to obtain the third blocks.

When the processor 302 performs polar encoding on the multiple third blocks, the processor 302 may directly perform polar encoding on the multiple third blocks. A polar encoding method in the prior art may be referred to for a polar encoding method for the third blocks, which will not be repeated redundantly in the present application.

When the processor 302 performs polar encoding on the multiple third blocks, the processor 302 may firstly perform interleaved mapping on the multiple third blocks to obtain multiple fourth blocks, and perform polar encoding on the multiple fourth blocks.

Further, when the processor 302 performs interleaved mapping on the third blocks to obtain the fourth blocks, the processor 302 may process in the following manner: it is assumed that the $r^{th}$ third block in the multiple third blocks is $C_r=[c_{r0}, c_{r1}, c_{r2}, c_{r3}, \ldots, c_{r(N-1)}]$, where $1 \leq r \leq C$. An interleaved sequence $\Pi_N=(i_0, i_1, i_2, \ldots, i_{N-1})$ is firstly determined, where $i_x \in \{0, \ldots, N-1\}$, $0 \leq x \leq N-1$, and any two elements of the interleaved sequence are different from each other. The processor 302 may perform interleaved mapping processing on the $r^{th}$ third block according to the interleaved sequence, wherein a relationship of the processed $r^{th}$ fourth block $C_r^\pi=[c_{r0}^\pi, c_{r1}^\pi, c_{r2}^\pi, c_{r3}^\pi, \ldots, c_{r(N-1)}^\pi]$ and the $r^{th}$ third block is as follows: $c_{ri_x}^\pi = c_{rx}$, $x=0, 1, \ldots, N-1$.

It should be understood that, in various embodiments of the present application, values of the sequential numbers of the above-mentioned processes do not represent an execution order. An execution order of the processes should be determined by functionalities and internal logics thereof, and should not constitute any limitation to implementation processes of the embodiments of the present application.

To those of ordinary skills in the art, units and algorithm steps of respective examples described in the embodiments disclosed in the present disclosure may be implemented by an electronic hardware or a combination of a computer software and an electronic hardware. Whether these functions are implemented in form of hardware or software is determined by a specific application and design constraint condition of the technical solutions. Professionals may implement the described functions by using different methods for each specific application, but this implementation should not be considered as beyond the scope of the present application.

Those skilled in the art may clearly understand that, for convenience and concision of description, the specific working processes of the system, apparatus and units described above may refer to corresponding processes in the foregoing method embodiments, and will not be repeated redundantly herein.

In several embodiments provided in the present application, it should be understood that, disclosed system, apparatus and method may be implemented in other manners. For example, the apparatus embodiments described above are merely exemplary, e.g., dividing of the units is merely a logic function dividing, other dividing manners may be adopted in a practical implementation. For example, multiple units or components may be combined or integrated to another system, or some features may be omitted or not implemented. From another point of view, the displayed or discussed mutual coupling or direct coupling or communication connection may be indirect coupling or communication connection of devices or units through some interfaces, and may be in electrical, mechanical or other form.

The units described as separate components may be separated physically or not, components displayed as units may be physical units or not, namely, may be located in one place, or may be distributed on multiple network units. A part of or all of the units may be selected to achieve the purposes of the technical solutions in the embodiments according to actual demand.

In addition, the respective functional units in the embodiments of the present application may be integrated in a processing unit, or the respective units separately physically exist, or two or more units are integrated in one unit.

If the function is implemented in a form of a software functional unit and is sold or used as an independent product, it may be stored in a computer readable storage medium. Based on such understanding, the technical solutions of the present application substantially, or a part contributing to the prior art, or a part of the technical solutions, may be implemented in a form of a software product. The computer software product is stored in a storage medium, and includes several instructions enabling a computer device (may be a personnel computer, a server, or a network device, etc.) to execute all or a part of the steps of the methods in the embodiments of the present application. The foregoing storage medium includes a variety of media capable of storing program codes such as, for example, a USB disk, a mobile hard disk, a read-only memory (ROM), a random access memory (RAM), a magnetic disk, an optical disk or the like.

The foregoing descriptions are merely specific implementation manners of the present application, rather than limiting the protection scope of the present application. Those skilled in the art could readily think of variations or substitutions within the disclosed technical scope of the present application, and these variations or substitutions shall fall within the protection scope of the present application. Accordingly, the protection scope of the present application shall be defined by the following claims.

What is claimed is:

1. An apparatus for processing data in a communication system, comprising:
   a processor and a memory;
   wherein the processor, by executing program instructions stored in the memory, is configured to:
   perform segmentation on a data block to obtain a plurality of first blocks, wherein a difference in bit length between any two first blocks is not more than one bit;
   for each first block, add one or more consecutive padding bits to obtain a second block of bit length K if the bit length of the first block is less than K, so as to obtain a plurality of second blocks corresponding to the first blocks, wherein K is a quantity of information bits of a polar code, and wherein a value of each padding bit is a preset value of 0 or 1;
   add N–K consecutive bits to each of the second blocks to obtain a plurality of third blocks, wherein the N–K consecutive bits have a fixed preset value of 0 or 1, and wherein N equals 2^n, n is an integer larger than 0, and N−K≥0; and perform polar encoding on the third blocks.

2. The apparatus of claim 1, wherein in performing the segmentation on the data block to obtain the first blocks, the processor is configured to:

divide the data block into C first blocks;

wherein a quantity of bits of each of the C first blocks, $K_r$, is as follows:

when 1≤r≤B' mod C, $K_r=\lceil B'/C \rceil$, and when B' mod C<r≤C, $K_r=\lfloor B'/C \rfloor$; or when 1≤r≤B' mod C, $K_r=\lfloor B'/C \rfloor$, and when B' mod C<r≤C, $K_r=\lceil B'/C \rceil$;

wherein r is a sequential quantity of the first block, 1≤r≤C, the quantity of the first blocks is $C=\lceil B/(K-J) \rceil$, a total quantity of bits of the C first blocks is B'=B+C·J, B is the quantity of bits of the data block, J is a quantity of check bits for performing cyclic redundancy check (CRC) on the first block, and 0≤J≤K.

3. The apparatus of claim 2, wherein in adding one or more consecutive padding bits to obtain a second block of bit length K if the bit length of the first block is less than K, the processor is configured to:

if the bit length of the $r^{th}$ first block $K_r$ is smaller than K, add $K-K_r$ padding bits to the $r^{th}$ first block to form the $r^{th}$ second block, wherein 1≤r≤C; and if the bit length of the first block is equal to K, take the first block as the second block.

4. The apparatus of claim 3, wherein in adding the $K-K_r$ padding bits to the $r^{th}$ first block to form the $r^{th}$ second block, the processor is configured to:

add the $K-K_r$ padding bits in front of the $r^{th}$ first block to form the $r^{th}$ second block;

wherein adding padding bits in front of the first block to form the second block is uniformly applied to all applicable first blocks.

5. The apparatus of claim 4, wherein in adding N−K consecutive bits to each of the second blocks to obtain a plurality of third blocks, the processor is configured to:

if the second block has at least one padding bit, add the N−K consecutive bits at a position that is in front of the at least one padding bit and is adjacent to the at least one padding bit; and if the second block does not have any padding bit, add the N−K consecutive bits at a position that is in front of the second block and is adjacent to the second block.

6. The apparatus of claim 3, wherein in adding the $K-K_r$ padding bits to the $r^{th}$ first block to form the $r^{th}$ second block, the processor is configured to:

add the $K-K_r$ padding bits behind the $r^{th}$ first block to form the $r^{th}$ second block;

wherein adding padding bits behind the first block to form the second block is uniformly applied to all applicable first blocks.

7. The apparatus of claim 6, wherein in adding N−K consecutive bits to each of the second blocks to obtain a plurality of third blocks, the processor is configured to:

if the second block has at least one padding bit, add the N−K consecutive bits at a position that is behind the at least one padding bit and is adjacent to the at least one padding bit; and if the second block does not have any padding bit, add the N−K consecutive bits at a position that is behind the second block and is adjacent to the second block.

8. The apparatus of claim 1, wherein in performing the polar encoding on the third blocks, the processor is configured to:

perform an interleaved mapping on the third blocks to obtain a plurality of fourth blocks; and perform polar encoding on the fourth blocks.

9. The apparatus of claim 8, wherein in performing the interleaved mapping on the third blocks to obtain the fourth blocks, the processor is configured to:

determine the fourth blocks according to a mapping relationship $c_{r i_x}^\pi = c_{rx}$, x=0, 1, . . . , N−1, wherein $C_r=[c_{r0}, c_{r1}, c_{r2}, c_{r3}, \ldots, c_{r(N-1)}]$ denotes the $r^{th}$ third block, $C_r^\pi=[c_{r0}^\pi, c_{r1}^\pi, c_{r2}^\pi, c_{r3}^\pi, \ldots, c_{r(N-1)}^\pi]$ denotes the $r^{th}$ fourth block, 1≤r≤C, C is a quantity of the third blocks, $\Pi_N=(i_0, i_1, i_2, \ldots, i_{N-1})$, $i_x \in \{0, \ldots, N-1\}$, 0≤x≤N−1 is an expression of an interleaved sequence of the interleaved mapping, and any two elements of the interleaved sequence are different from each other.

* * * * *